United States Patent
Cheng et al.

(10) Patent No.: US 7,563,670 B2
(45) Date of Patent: Jul. 21, 2009

(54) METHOD FOR ETCHING SINGLE-CRYSTAL SEMICONDUCTOR SELECTIVE TO AMORPHOUS/POLYCRYSTALLINE SEMICONDUCTOR AND STRUCTURE FORMED BY SAME

(75) Inventors: Kangguo Cheng, Beacon, NY (US); Richard O. Henry, Poughkeepsie, NY (US); Kenneth T. Settlemyer, Jr., Bradeonton, FL (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 11/558,974

(22) Filed: Nov. 13, 2006

(65) Prior Publication Data

US 2008/0111175 A1    May 15, 2008

(51) Int. Cl.
*H01L 21/8242* (2006.01)
*H01L 21/336* (2006.01)
*H01L 21/20* (2006.01)

(52) U.S. Cl. .................. 438/243; 438/270; 438/387; 257/E21.652

(58) Field of Classification Search ............... 438/239, 438/242, 243, 245, 246, 386, 387, 270; 257/E21.652
See application file for complete search history.

(56) References Cited

U.S. PATENT DOCUMENTS

| 4,681,657 | A | 7/1987 | Hwang et al. |
|---|---|---|---|
| 5,027,173 | A | 6/1991 | Satoh |
| 5,030,590 | A | 7/1991 | Amini et al. |
| 5,208,657 | A | 5/1993 | Chatterjee et al. |
| 5,976,767 | A | 11/1999 | Li |
| 6,335,247 | B1 | 1/2002 | Tews et al. |
| 6,969,648 | B2 | 11/2005 | Cheng et al. |
| 6,972,266 | B2 | 12/2005 | Divakaruni et al. |
| 6,998,666 | B2 | 2/2006 | Beintner et al. |
| 7,190,042 | B2 * | 3/2007 | Divakaruni et al. ......... 257/510 |
| 7,211,483 | B2 * | 5/2007 | Chen et al. .................. 438/243 |
| 2002/0197874 | A1 | 12/2002 | Divakaruni et al. |
| 2005/0026363 | A1 | 2/2005 | Cheng et al. |
| 2005/0059214 | A1 | 3/2005 | Cheng et al. |
| 2005/0212027 | A1 | 9/2005 | Adam et al. |

* cited by examiner

*Primary Examiner*—George Fourson
*Assistant Examiner*—Phillip Green
(74) *Attorney, Agent, or Firm*—DeLio & Peterson, LLC; Kelly M. Nowak; Todd M. C. Li

(57) ABSTRACT

A method of forming a vertical DRAM device. A lower trench is filled with polycrystalline or amorphous semiconductor for a capacitor. An upper trench portion has exposed sidewalls of single-crystal semiconductor. The method then includes etching the single-crystal semiconductor sidewalls to widen the upper trench portion beyond the exposed upper surface of the semiconductor fill of the capacitor to form exposed regions of single-crystal semiconductor on a bottom portion of the upper trench adjacent to the exposed upper surface of the semiconductor fill. A trench top insulating layer is deposited on the bottom portion of the upper trench, over the upper surface of the semiconductor fill and over the adjacent regions of single-crystal semiconductor. The method then includes forming a vertical gate dielectric layer, wherein the trench top insulating layer extends below the vertical gate insulating layer.

16 Claims, 11 Drawing Sheets

METHOD FOR ETCHING SINGLE-CRYSTAL SEMICONDUCTOR SELECTIVE TO AMORPHOUS/POLYCRYSTALLINE SEMICONDUCTOR AND STRUCTURE FORMED BY SAME

BACKGROUND OF THE INVENTION

1. Field of the Invention

The present invention relates to semiconductor processing and, in particular, to the fabrication of integrated circuits using selective etching of single-crystal semiconductor relative to polycrystalline or amorphous semiconductor to manufacture vertical dynamic random access memory (DRAM) and other devices.

2. Description of Related Art

Vertical dynamic random access memory (DRAM) circuits and devices have been employed to reduce effective cell size and increase memory density. Typically a vertical DRAM memory cell comprises a capacitor in the lower portion of the trench, with the vertical metal oxide semiconductor field effect transistor (MOSFET) in the upper portion of the trench. The top portion of the trench has an octagonal shape after deep trench etch. It is usually desired to transform the shape of the upper trench portion to a rectangular shape to improve process margin and device performance.

A prior art method for trench shaping the MOSFET is shown in FIGS. 1a, 1b, 2a, 2b, 3a, 3b, 4a, 4b and 5. FIGS. 1a and 1b show an intermediate structure in which a trench has been etched in a single crystal semiconductor substrate 20 through an upper pad nitride layer 32 and a lower pad oxide layer 30. A capacitor is formed having node dielectric 24 along the sidewall of the lower trench of substrate 20 and an oxide collar 26 disposed along the sidewall above the trench capacitor. The lower trench is filled with amorphous or polycrystalline semiconductor (polysilicon) 22 and the polysilicon 22 is recessed above the collar 26 to later form adjacent buried strap diffusion regions 46 in FIG. 5. The buried strap regions 46 form an electrical bridge from the capacitor to the upper MOSFET region to be formed in the upper trench portion. The upper trench has an octagonal shape in plan view, as shown in FIG. 1b.

Since the upper trench sidewall 28 is exposed, a crystallographic orientation dependent silicon etch can be performed to change the shape to a rectangle. However, before shaping the upper trench, as shown in FIGS. 2a and 2b a trench top oxide (TTO) 34 is deposited atop the polysilicon 22 to prevent the polysilicon 22 from being etched. As shown in FIGS. 3a and 3b, the exposed trench sidewall 28 is then etched to form new sidewalls 28' in the upper trench having a rectangular shape in plan view (FIG. 3b). Optionally, the exposed edge portions of pad oxide 30 and pad nitride 32 are also etched to have their edges aligned with the new sidewalls 28'. As a result of such prior art trench shaping, sharp corners 36 are formed in the substrate walls between the vertical sidewall 28' of substrate 20 and horizontal wall portion 28'a of substrate 20 adjacent to and outside the top surface of TTO 34. When the gate oxide is grown in the trench, as shown in FIGS. 4a and 4b, it is formed as oxide layer 38 on the vertical sidewalls and oxide layer 38a on the horizontal wall. The oxide layer is thinner at sharp corners 36', as shown in the enlarged portion of FIG. 4a. Even if a uniform oxide 38 can be grown, a high electrical field can be produced at these corners 36' due to the geometric effect. FIG. 5 shows a complete DRAM cell with a vertical MOSFET formed in the shaped upper trench comprising filled gate conductor 40 such as polysilicon, a first n+ doped source/drain terminal 44, and a second n+ source/drain terminal—the buried strap diffusion region 46. An oxide layer 42 may be formed to cover the n+ doped layer 44. The combination of thinner gate oxide and the higher electric field in this prior art DRAM construction at corners 36' shown in FIG. 4a degrades device performance and causes severe reliability problems. Furthermore, the isolation between gate poly 40 above TTO 34 and the polysilicon 22 below the TTO relies on both the TTO and gate oxide layer 38. Since the thickness of the TTO at typically about 30 nm is usually much greater than the thickness of the gate oxide at typically about 6 nm, the thin gate oxide results in poor isolation of the vertical MOSFET.

Selective etch is very important in semiconductor manufacturing. It is well known that hydroxide, including ammonium hydroxide (NH$_4$OH) solution and alkaline solutions such as KOH, etches silicon. Organic solutions such as tetramethylammonium hydroxide (TMAH), hydrazine, and ethylene diamine pyrocatechol (EDP) can also be used to etch silicon. Alkaline solutions have the drawback of metal contamination (e.g., KOH will plate out potassium ions), and organic solutions are usually toxic, unstable, and difficult to handle. In contrast, NH$_4$OH does not contain any metal ions and thus is compatible with semiconductor processing. It is much less toxic compared with organic solutions. Due to these distinct advantages, NH$_4$OH has been widely adopted in semiconductor manufacturing to etch silicon. Use of NH$_4$OH is described in U.S. Pat. Nos. 4,681,657, 5,030,590 and 5,976,767. It has also been previously known in the art that the process is electrochemical, that doping of silicon will affect etch rate and selectivity can be gained this way. Further, it has been known that NH$_4$OH etches amorphous or polycrystalline semiconductor at a much faster rate than single-crystal semiconductor, to permit amorphous or polycrystalline semiconductor to be etched selectively to single-crystal semiconductor. For example, such a selective etch process has been used to form a buried strap in a vertical transistor DRAM of the type described above. While in many other applications there is a need to etch single-crystal semiconductor selective to amorphous or polycrystalline semiconductor, no prior art method has been able to achieve this purpose.

SUMMARY OF THE INVENTION

Bearing in mind the problems and deficiencies of the prior art, it is therefore an object of the present invention to provide an improved method of forming a transistor portion over a capacitor in a vertical DRAM device.

It is another object of the present invention to provide a vertical trench DRAM memory with self-aligned trench top shaping.

A further object of the invention is to provide a method of selective etching of single-crystal semiconductor with respect to amorphous or polycrystalline semiconductor.

It is yet another object of the present invention to provide a method of using selective etching of single-crystal semiconductor in the manufacture of a vertical trench DRAM memory cell.

Still other objects and advantages of the invention will in part be obvious and will in part be apparent from the specification.

The above and other objects, which will be apparent to those skilled in the art, are achieved in the present invention which is directed to a method of forming a transistor portion over a capacitor in a vertical DRAM device comprising providing a partially formed vertical DRAM structure having a lower trench portion filled with polycrystalline or amorphous semiconductor for a capacitor, with the polycrystalline or amorphous semiconductor having an exposed upper surface, and an upper trench portion having exposed sidewalls of single-crystal semiconductor above the upper surface of the polycrystalline or amorphous semiconductor fill. The method then includes etching the single-crystal semiconductor sidewalls to widen the upper trench portion beyond the exposed upper surface of the polycrystalline or amorphous semiconductor fill of the capacitor to form exposed regions of single-crystal semiconductor on a bottom portion of the upper trench adjacent to the exposed upper surface of the polycrystalline or amorphous semiconductor fill. Subsequently, the method includes depositing a trench top insulating layer on the bottom portion of the upper trench, over the upper surface of the polycrystalline or amorphous semiconductor fill and over the regions of single-crystal semiconductor adjacent to the upper surface of the polycrystalline or amorphous semiconductor fill. The method then includes forming on the etched single-crystal semiconductor sidewalls of the upper trench portion a vertical gate dielectric layer, wherein the trench top insulating layer extends below the vertical gate insulating layer. Subsequently the method includes forming a vertical MOSFET to complete the vertical DRAM.

The single-crystal semiconductor may comprise single-crystal silicon and the amorphous or polycrystalline semiconductor may comprise amorphous or polycrystalline silicon. The single-crystal semiconductor and the amorphous or polycrystalline semiconductor may be doped with a semiconductor dopant selected from the group consisting of phosphorus (P), arsenic (As), antimony (Sb), boron (B), indium (In), and thallium (Tl). The semiconductor dopant may have a concentration ranging from about $10^{14}$ cm$^{-3}$ to about $10^{21}$ cm$^{-3}$. Preferably, the amorphous or polycrystalline semiconductor comprises amorphous or polycrystalline silicon doped by an n-type dopant with a doping concentration greater than $10^{19}$ cm$^{-3}$.

The etching of the single-crystal semiconductor sidewalls is preferably by simultaneous contact of the single-crystal semiconductor and polycrystalline or amorphous semiconductor with an ammonium hydroxide (NH$_4$OH) solution to selectively etch the single-crystal semiconductor. The etching of the single-crystal semiconductor sidewalls is more preferably by contact of the single-crystal semiconductor and polycrystalline or amorphous semiconductor with an ammonium hydroxide (NH$_4$OH) solution in the presence of an amount of light radiation sufficient to selectively etch the single-crystal semiconductor with respect to the polycrystalline or amorphous semiconductor. The ammonium hydroxide solution may be simultaneously contacted with surfaces of the single-crystal semiconductor and the polycrystalline or amorphous semiconductor areas. Preferably, this includes exposing the ammonium hydroxide solution to atmospheric air during the selective etching. The ammonium hydroxide solution may be an approximately 50:1 solution of water and NH$_4$OH.

Preferably, the trench top insulating layer has an upper surface, and the vertical gate dielectric layer extends no lower than the trench top insulating layer upper surface, so that the upper trench portion extends horizontally beyond all sides of the upper surface of the polycrystalline or amorphous semiconductor in the lower trench portion.

Preferably, the upper trench portion is rectangular in plan view, and the trench top insulating layer is self-aligned to the sidewalls of the upper trench portion.

In another aspect, the present invention is directed to a vertical DRAM device comprising a single-crystal substrate having a trench formed therein. A lower trench portion of the trench is filled with polycrystalline or amorphous semiconductor having an upper surface to form a capacitor. An upper trench portion has a bottom portion of single-crystal semiconductor extending outward of and adjacent to the upper surface of the polycrystalline or amorphous semiconductor fill and having upwardly extending sidewalls of single-crystal semiconductor. A trench top insulating layer extends over the upper surface of the polycrystalline or amorphous semiconductor fill and outward of the polycrystalline or amorphous semiconductor fill over the single-crystal semiconductor bottom portion of the upper trench. A vertical gate dielectric layer is adjacent the single-crystal semiconductor sidewalls of the upper trench portion. The trench top insulating layer extends below the vertical oxide layer. A conductor fill is within the vertical gate dielectric layer and over the trench top insulating layer to form a vertical transistor.

The trench top insulating layer has an upper surface, and the vertical gate dielectric layer preferably extends no lower than the trench top insulating layer upper surface. The upper trench portion is also preferably rectangular in plan view, and extends horizontally beyond all sides of the upper surface of the polycrystalline or amorphous semiconductor in the lower trench portion. The trench top insulating layer is preferably self-aligned to the sidewalls of the upper trench portion.

The single-crystalline semiconductor and the amorphous or polycrystalline semiconductor may be silicon, germanium, silicon germanium, and/or carbon doped silicon.

The trench top insulating layer may comprise at least one material selected from a group consisting of oxide, nitride, and oxynitride. The vertical gate dielectric may comprise at least one material selected from a group consisting of silicon oxide, silicon nitride, silicon oxynitride, and high-k dielectric materials.

In a further aspect, the present invention is directed to a method of selectively etching single-crystal semiconductor relative to polycrystalline or amorphous semiconductor in an electronic device comprising initially providing an electronic device structure having a first exposed area of single-crystal semiconductor and a second exposed area of polycrystalline or amorphous semiconductor. The method then includes contacting both exposed areas with an ammonium hydroxide (NH$_4$OH) solution in the presence of an amount of light radiation sufficient to selectively etch the single-crystal semiconductor with respect to the polycrystalline or amorphous semiconductor.

The ammonium hydroxide solution is preferably simultaneously contacted with surfaces of the single-crystal semiconductor area and the polycrystalline or amorphous semiconductor area. More preferably, the method further includes exposing the ammonium hydroxide solution to atmospheric air during the selective etching. The ammonium hydroxide solution may be an approximately 50:1 solution of water and NH$_4$OH.

Preferably, the electronic device structure comprises an intermediate stage of a vertical DRAM, wherein the single-crystal semiconductor area is on the sidewalls of an open upper trench, and the polycrystalline or amorphous semiconductor area is on an exposed upper surface of a semiconductor fill of a capacitor below the upper trench. The selective etching of the single-crystal semiconductor sidewalls widens the upper trench horizontally beyond the exposed upper surface of the polycrystalline or amorphous semiconductor fill of the capacitor to form exposed regions of single-crystal semiconductor on a bottom portion of the upper trench adjacent to the exposed upper surface of the polycrystalline or amorphous semiconductor fill. This preferred method may further include depositing a trench top insulating layer on the bottom portion of the upper trench, over the upper surface of the polycrystalline or amorphous semiconductor fill and over the regions of single-crystal semiconductor adjacent to the upper surface of the polycrystalline or amorphous semiconductor fill, and subsequently forming a vertical MOSFET to complete the vertical DRAM.

The single-crystalline semiconductor and the amorphous or polycrystalline semiconductor may comprise silicon, germanium, silicon germanium, and/or carbon doped silicon.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 6-13 of the drawings in which like numerals refer to like features of the invention.

This invention is directed to a method of etching single-crystal semiconductor selective to amorphous/polycrystalline semiconductor by an inventive selection of process parameters. Additionally this invention is directed to a unique vertical DRAM structure and method of forming that structure by using the above-mentioned semiconductor etching process.

Figure 6:
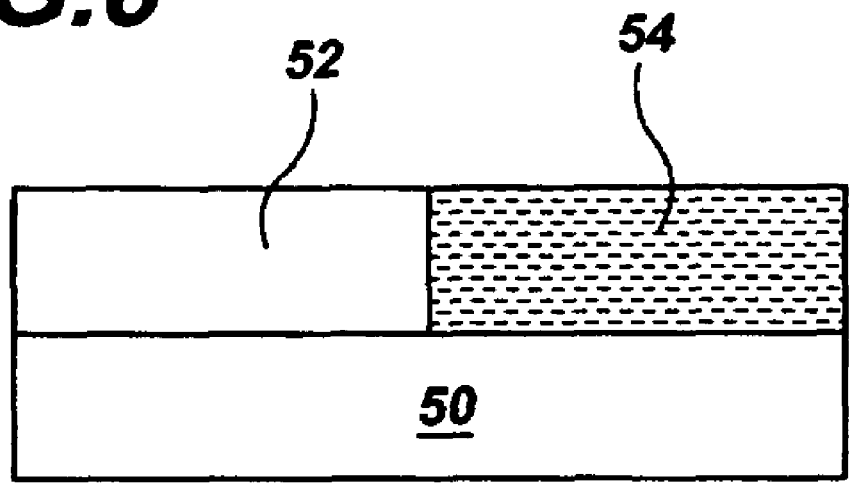
FIG. 6 is a side cross-sectional view of a substrate having deposited thereon side-by-side layers of single-crystal semiconductor and amorphous or polycrystalline semiconductor.

The preferred selective etching process comprises the following steps. Referring to FIG. 6, a semiconductor substrate 50 is provided. Substrate 50 may have a monolithic structure such as a single-crystal semiconductor wafer, ceramic substrate, conductive object or dielectric object. Alternatively, substrate 50 includes a plurality of layers such as a processed wafer or portion thereof such as a chip which comprises one or multiple semiconductor devices. All of the layers of such wafer can be collectively referenced as the substrate or just some of the layers can be referenced as the "substrate."

An amorphous or polycrystalline semiconductor layer 52 and a single-crystal semiconductor layer 54 are formed on substrate 50. Amorphous or polycrystalline semiconductor layer 52 and single-crystal semiconductor layer 54 may consist of at least one of the following materials, including but not limited to, silicon, germanium, silicon germanium, silicon carbide, and carbon-doped silicon. Furthermore, the amorphous or polycrystalline semiconductor layer 52 and the single-crystal semiconductor layer 54 can be undoped or doped with at least one n-type or p-type dopant. In one embodiment, semiconductor layer 52 comprises amorphous silicon and semiconductor layer 54 comprises single-crystal silicon. In another embodiment, semiconductor layer 52 comprises polycrystalline silicon and semiconductor layer 54 comprises single-crystal silicon.

To illustrate the method of the present invention, layer 52 and 54 may be in other positions relative to the substrate. For example, layer 52 and 54 can be structurally next to each other. Alternatively, layers 52 and 54 can be separated by other structures (not shown). Also, the top surface of layer 52 may be above or below layer 54, or part or entire portion of layer 52 may be overlapped with 54.

Starting the structure of FIG. 6, the wafer surface is first cleaned by an SC-1 solution consisting of deionized water (DIW), hydrogen peroxide ($H_2O_2$) and ammonium hydroxide ($NH_4OH$) (preferred solution concentration of DIW:$H_2O_2$:$NH_4OH$=50:1.5:1 in volume) to remove surface organics. Optionally, mega-sonic energy can be provided to aid the cleaning process. Next, the native oxide (not shown), if present at the surface of layers 52 and 54, can be removed by a dry or wet etching process. In one embodiment, the native oxide is removed by an aqueous solution containing a diluted hydrofluoric (HF) acid with a concentration of 300:1 (volume ratio between DIW and 49% HF acid) for 120 seconds. The DIW is a degasified DIW with an oxygen level equal or below 12 ppb and a nitrogen level equal or below 1 ppm.

Figure 7:
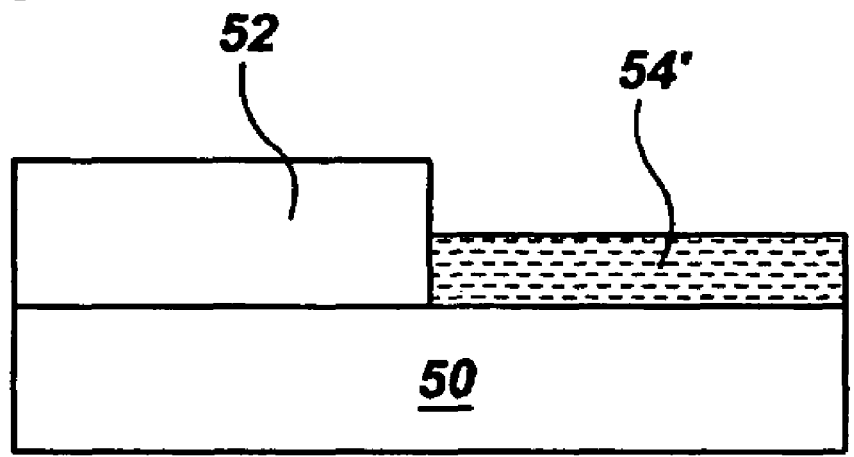
FIG. 7 is a side cross-sectional view of the structure of FIG. 6 after the single-crystal semiconductor has been selectively etched, relative to the amorphous or polycrystalline semiconductor, by the method of the present invention.

Next, an ammonium hydroxide ($NH_4OH$) solution is used to etch the single-crystal semiconductor 54 selective to the amorphous or polycrystalline semiconductor 52. In one embodiment, the $NH_4OH$ solution is injected into a tank, and the substrates are immersed into the chemistry such that the surface of layers 52 and 54 are exposed to the chemistry in this open-top tank in the presence of room (atmospheric) air and ambient light. Preferably, the etch temperature is set at 0-100° C., more preferably at 15-85° C., and most preferably at 25° C. The $NH_4OH$ solution comprises a concentration of $H_2O$: $NH_4OH$ preferably ranging from 10:1 to 200:1, more preferably ranging from 20:1 to 100:1, and most preferably 50:1. The etch selectivity—the ratio between the amount of single-crystal semiconductor 54 being removed and the amount of amorphous or polycrystalline semiconductor being removed—is preferably greater than 5:1, more preferably 10:1 and most preferably 50:1, regardless of dopant concentrations and dopant types of amorphous or polycrystalline semiconductor 52 and single-crystal semiconductor 54. In one embodiment, as shown in FIG. 7, a part or entire portion of the single-crystal semiconductor which comprises single-crystal silicon, is removed, leaving a desired portion of single-crystal semiconductor layer 54', while most of semiconductor layer 52, which comprises amorphous or polycrystalline silicon, remains intact. Semiconductor layers 54 and 52 may be undoped or doped. When doped, the semiconductor layers 54 and 52 may comprise n-type or p-type dopants with a concentration ranging from about $10^{14}$ $cm^{-3}$ to about $10^{21}$ $cm^{-3}$.

Figure 1A:
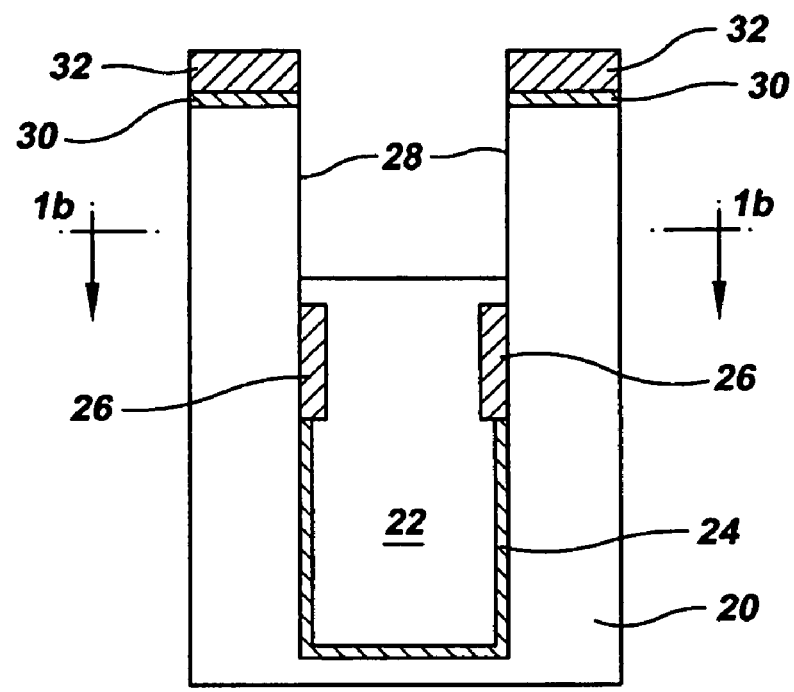
FIG. 1a is a side cross-sectional view of a prior art intermediate structure for forming a DRAM memory.
Figure 1B:
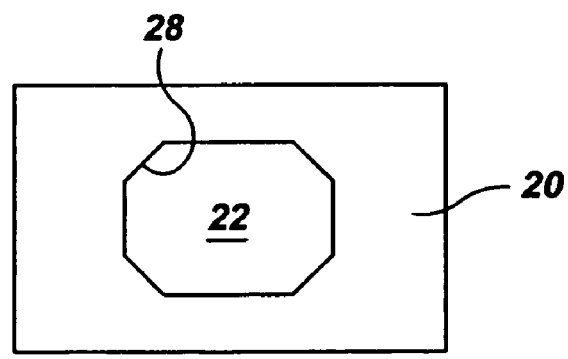
FIG. 1b is a sectional plan view of the structure of FIG. 1a along line 1b-1b.
Figure 2A:
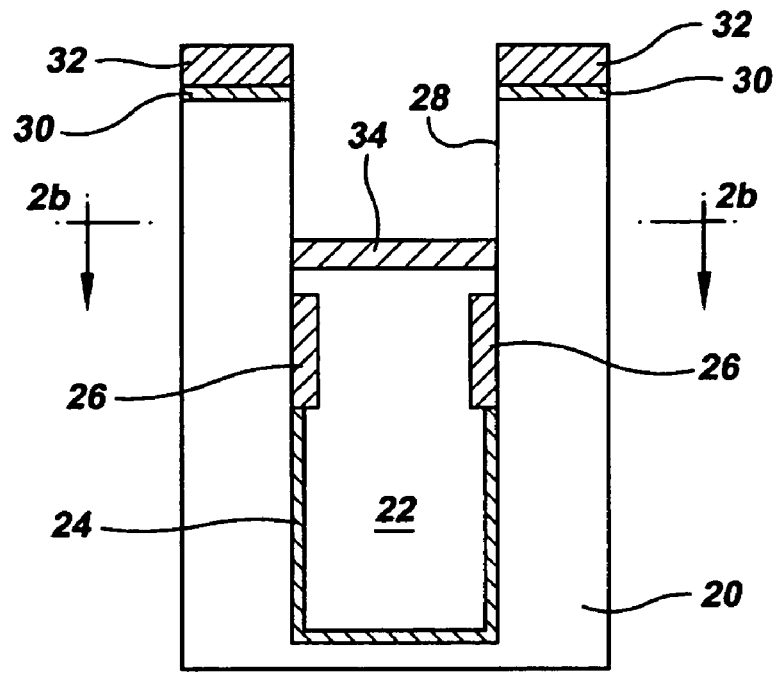
FIG. 2a is a side cross-sectional view of the prior art structure of FIG. 1a after depositing the TTO.
Figure 2B:
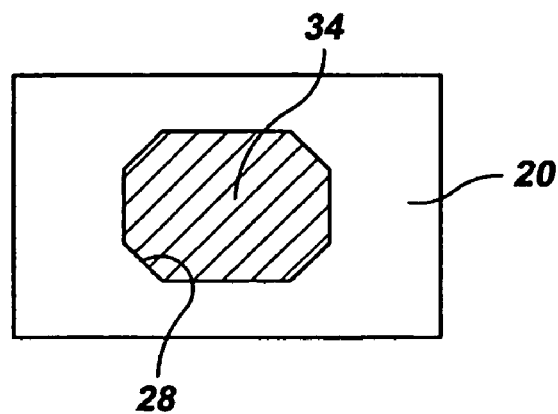
FIG. 2b is a sectional plan view of the structure of FIG. 2a along line 2b-2b.
Figure 3A:
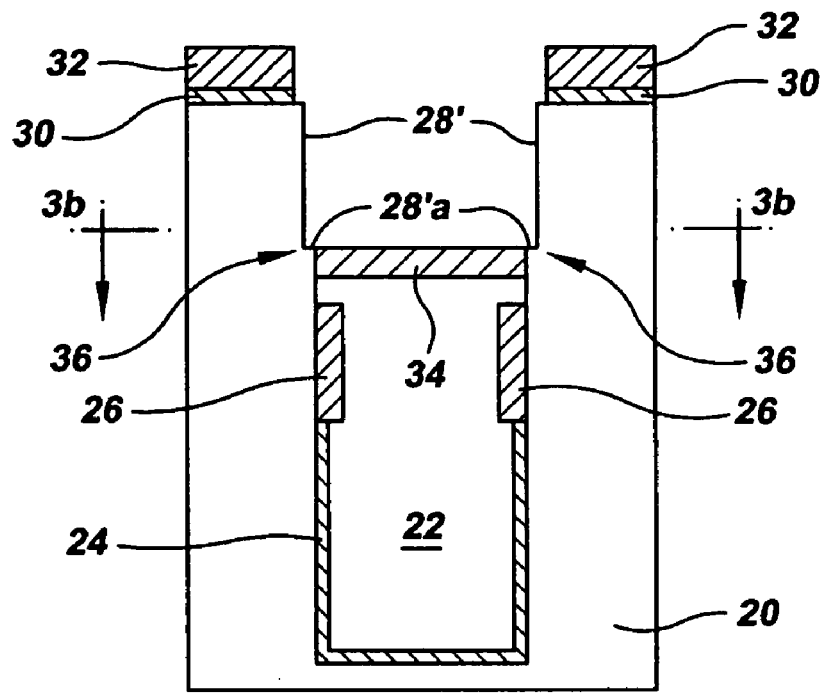
FIG. 3a is a side cross-sectional view of the prior art structure of FIG. 2a after reshaping the upper trench portion.
Figure 3B:
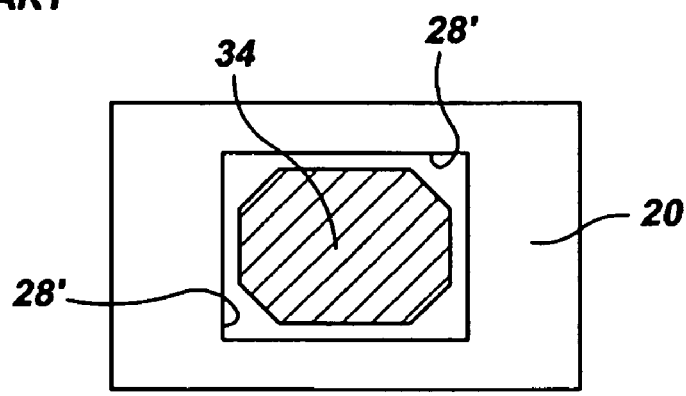
FIG. 3b is a sectional plan view of the structure of FIG. 3a along line 3b-3b.
Figure 4A:
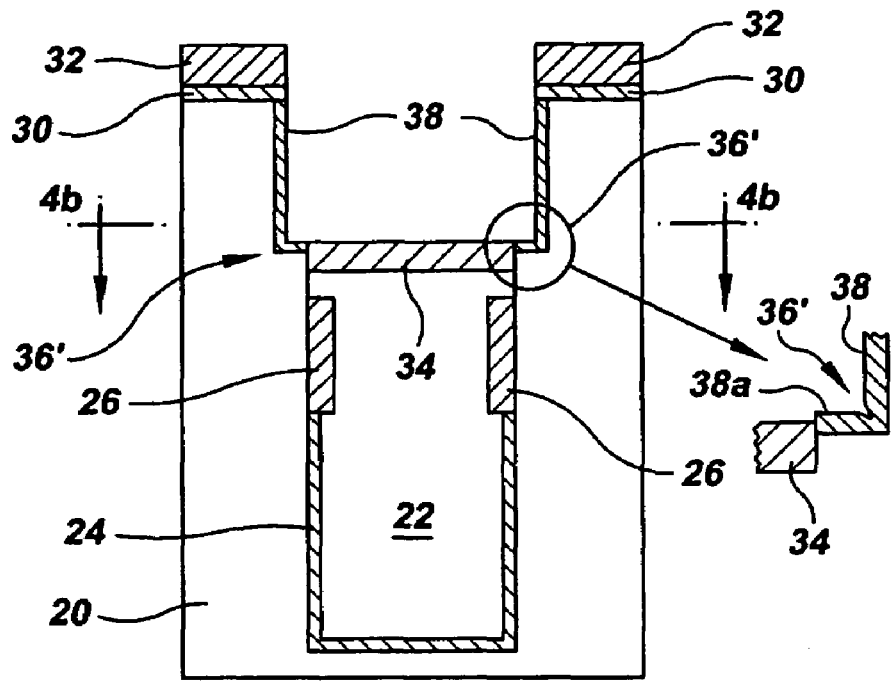
FIG. 4a is a side cross-sectional view of the prior art structure of FIG. 3a after forming the gate oxide in the upper trench portion, with an enlargement of the corner portion of the trench near the TTO.
Figure 4B:
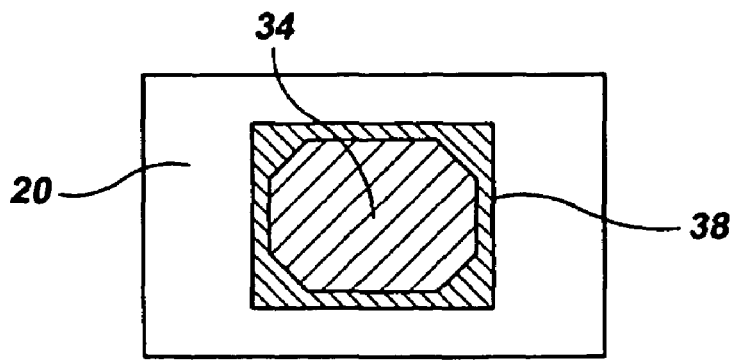
FIG. 4b is a sectional plan view of the structure of FIG. 4a along line 4b-4b.
Figure 5:
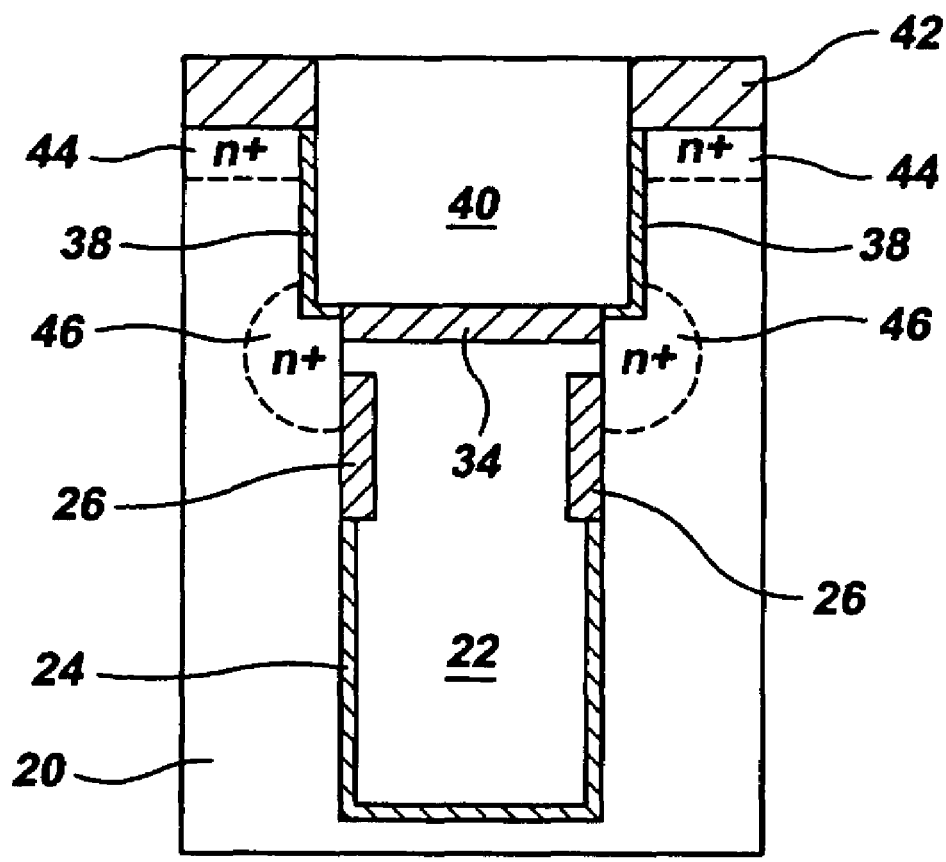
FIG. 5 is a side cross-sectional view of the prior art structure of FIG. 4a after forming the vertical transistor in the upper trench portion and completing the DRAM.
Figure 8A:
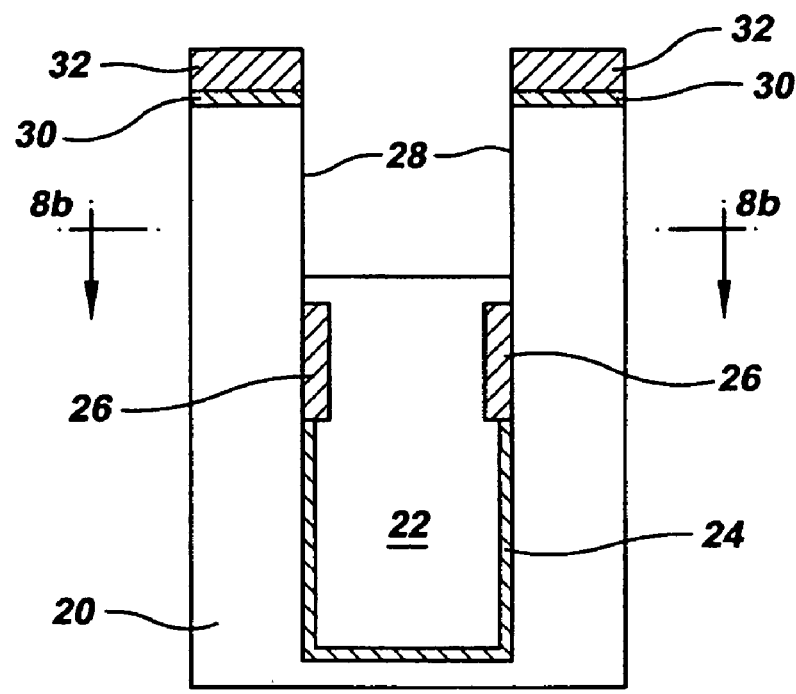
FIG. 8a is a side cross-sectional view of an intermediate structure for forming a DRAM memory in accordance with the present invention.

FIGS. 8a-13 depict the method of making and the intermediate and final structures of the vertical DRAM of the present invention. FIGS. 8a and 8b show the starting structure, which is similar to the structure shown in FIGS. 1a and 1b, respectively. However, instead of depositing the TTO to cover the trench polysilicon as in the prior art, the process of the present invention employs the selective etch process described above to etch the single-crystal semiconductor substrate 20 selective to the exposed amorphous or polycrystalline semiconductor fill 22. In one embodiment, semiconductor substrate 20 comprises single-crystal silicon and semiconductor fill 22 comprise amorphous or polycrystalline silicon doped by n-type dopants such as phosphorus (P), arsenic (As) and/or antimony (Sb) with a doping concentration greater than $10^{19}$ $cm^{-3}$. In another embodiment, semiconductor fill 22 comprise amorphous or polycrystalline silicon doped with p-type dopants such as boron (B), boron fluoride (BF2), gallium (Ga), indium (In), and/or thallium (Ti) with a doping concentration greater than $10^{19}$ $cm^{-3}$. The semiconductor substrate 20 and semiconductor fill 22 may comprise any of the compositions disclosed in connection with the single-crystal semiconductor layer 54 and amorphous or polycrystalline semiconductor layer 52, as described in connection with FIGS. 6 and 7.

In one embodiment, an $NH_4OH$ solution comprise $H_2O$ and $NH_4OH$ with a concentration of 50:1 is used in the presence of light for 15 seconds to etch exposed single-crystal semiconductor sidewalls 28 without substantially etching the amorphous or polycrystalline semiconductor fill 22. For clarity, the amorphous or polycrystalline semiconductor fill 22 is referred to as trench polysilicon 22.

Figure 8B:
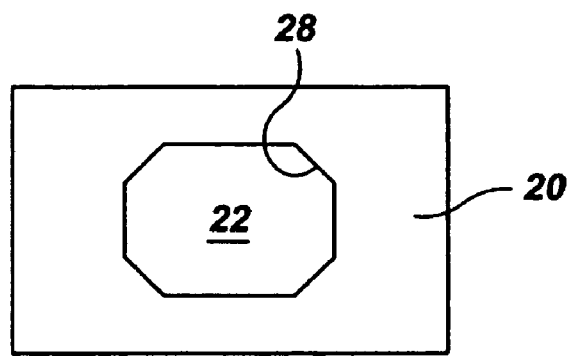
FIG. 8b is a sectional plan view of the structure of FIG. 8a along line 8b-8b.
Figure 9A:
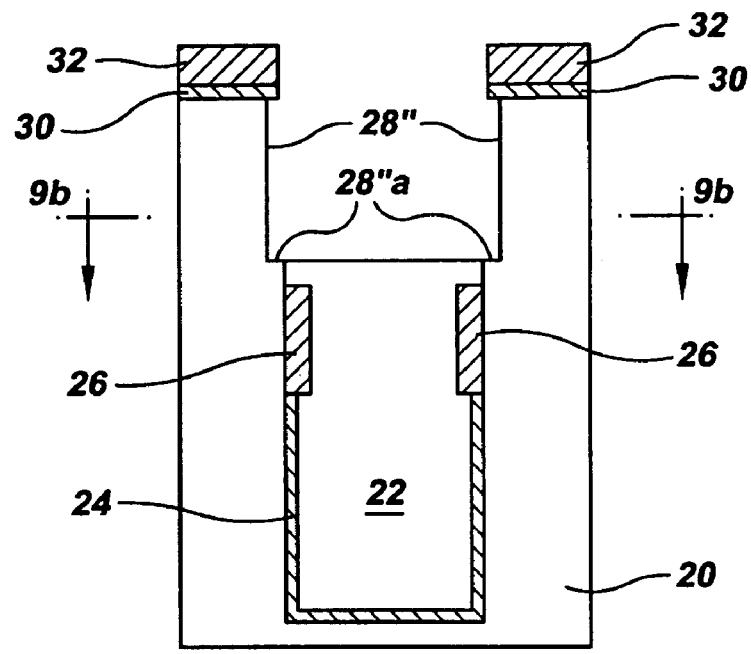
FIG. 9a is a side cross-sectional view of the structure of FIG. 8a after selectively reshaping the upper trench portion.
Figure 9B:
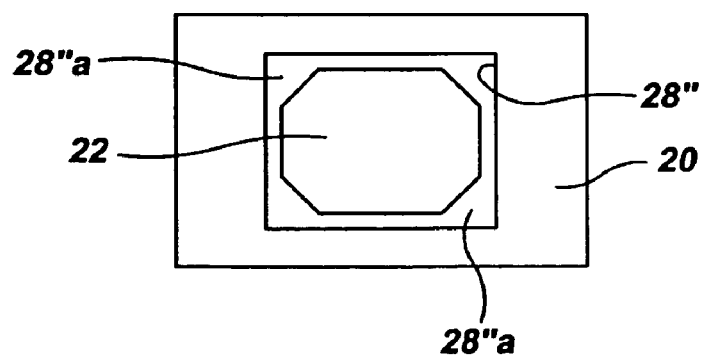
FIG. 9b is a sectional plan view of the structure of FIG. 9a along line 9b-9b.

As depicted in FIGS. 9a and 9b, after the selective etch, due to the crystalline orientation dependent etch, i.e., the $NH_4OH$ solution etches some crystallographic planes at a greater rate than other crystallographic planes, the shape of the upper trench is changed to a rectangular shape in plan view (FIG. 9b) from the original octagonal shape as shown in FIG. 8b. For example, the $NH_4OH$ solution can etch {100} planes at a rate about 10 to 100 times greater than it etches {110} planes.

In doing so, the upper trench is widened in all directions so that sidewalls 28" extend outward of trench polysilicon 22 in all directions horizontally, and the bottom portion of the upper trench has an exposed single crystal semiconductor floor 28"a, on essentially the same plane and adjacent to the top of trench polysilicon 22.

Figure 10A:
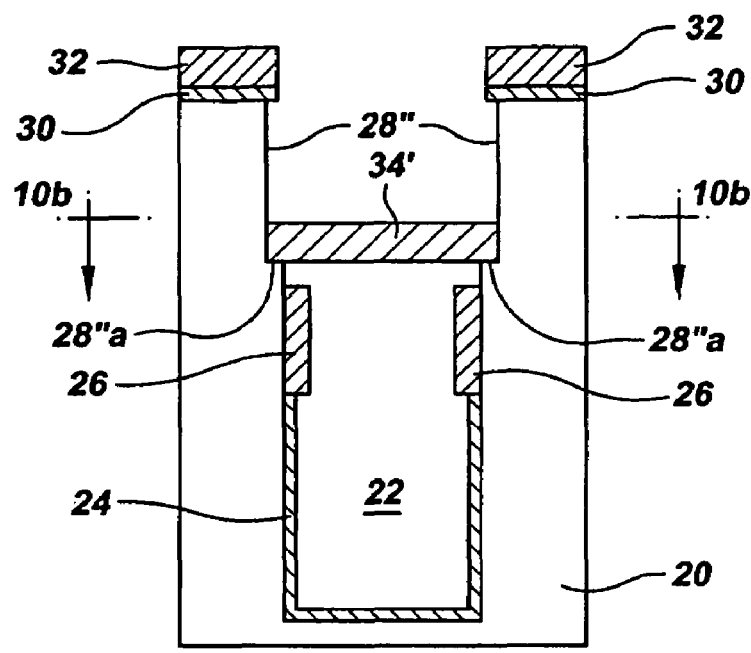
FIG. 10a is a side cross-sectional view of the structure of FIG. 9a after depositing the TTO in the selectively reshaped upper trench.

Only after the upper trench is selectively etched, a trench top insulating layer 34' is deposited atop trench polysilicon 22, as shown in FIGS. 10a ands 10b. The trench top insulating layer may comprise one or multiple materials, including but not limited to, oxide, nitride, oxynitride, and high-k materials (e.g., materials with a dielectric constant greater than 4). Trench top insulting layer 34' may be deposited by otherwise conventional, well-known methods, and is of any composition normally employed, such as thermal oxidation, chemical vapor deposition (CVD). In one embodiment, trench top insulating layer 34' comprises silicon oxide formed by high density plasma (HDP) CVD deposition followed by a timed etchback to remove the deposited material from the trench sidewall, leaving a trench top oxide (TTO) layer 34' atop trench polysilicon 22.

Figure 10B:
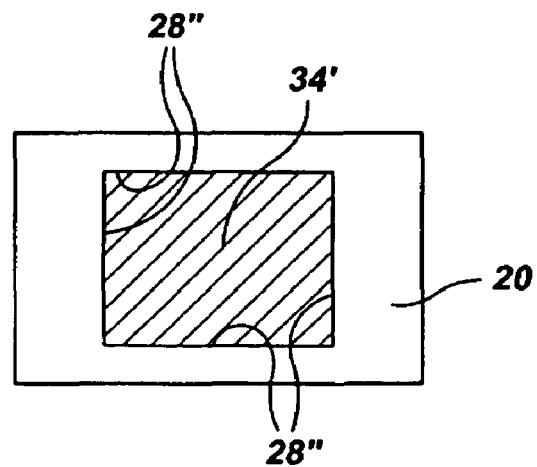
FIG. 10b is a sectional plan view of the structure of FIG. 10a along line 10b-10b.

Compared to prior art where TTO is deposited before trench shaping, by depositing the TTO after trench shaping both the entire the trench polysilicon 22 and the lower portion of shaped trench 28"a adjacent to the top of the trench polysilicon 22 are covered by TTO. The structure after TTO formation is shown in FIGS. 10a and 10b, where TTO 34' is self aligned to the bottom of the rectangular upper trench, and includes edge portions that extend outward horizontally beyond the polysilicon fill 22 and over single crystal semiconductor portions 28"a on each side of the TTO.

Figure 11A:
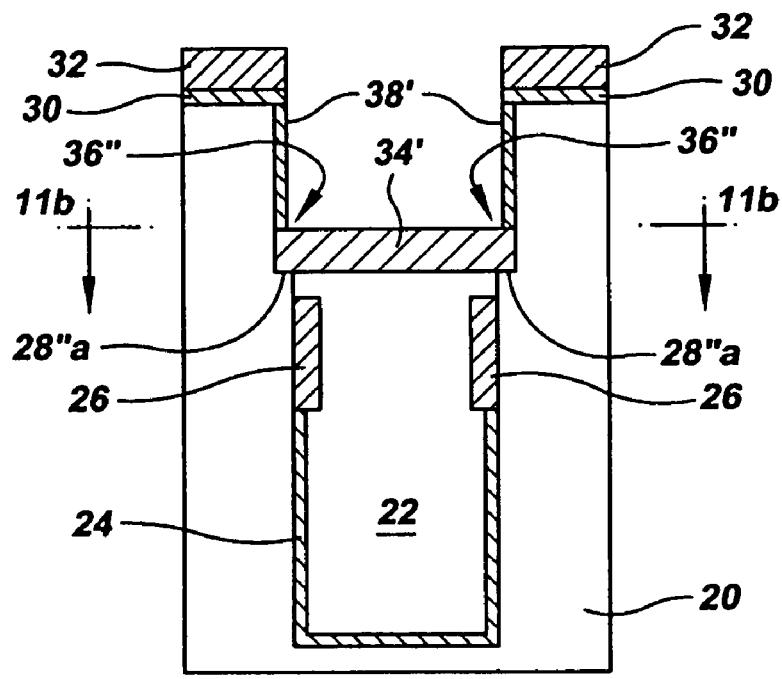
FIG. 11a is a side cross-sectional view of the structure of FIG. 10a after forming the gate oxide in the upper trench portion.
Figure 11B:
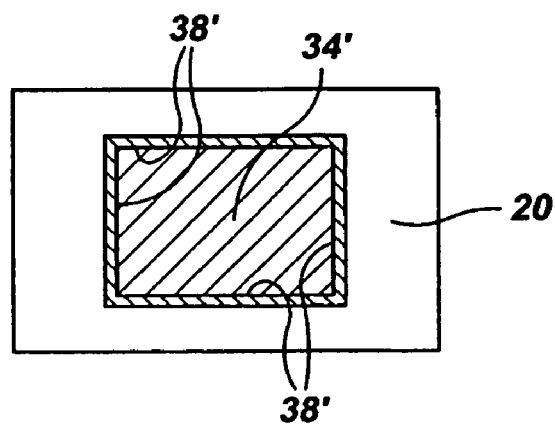
FIG. 11b is a sectional plan view of the structure of FIG. 11a along line 11b-11b.

Subsequently, FIGS. 11a and 11b show that a vertical gate dielectric 38' is grown on the upper trench sidewall 28". The vertical gate dielectric may comprise any dielectric material, including but not limited to, silicon oxide, silicon nitride, silicon oxynitride, high-k material, and any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials. Vertical gate dielectric 38' may be deposited by otherwise conventional, well-known methods, and is of any composition normally employed, such as thermal oxidation, chemical oxidation, thermal nitridation, atomic layer deposition, chemical vapor deposition, molecular beam epitaxy, physical vapor deposition, ion beam deposition, electron beam deposition, and/or laser assisted deposition. In one embodiment, the vertical gate dielectric comprises silicon oxide formed by thermal oxidation. The vertical gate oxide 38' extends around and over sidewalls 28", and abuts the top of TTO 34', which itself extends horizontally fully to the upper trench sidewalls.

Figure 12:
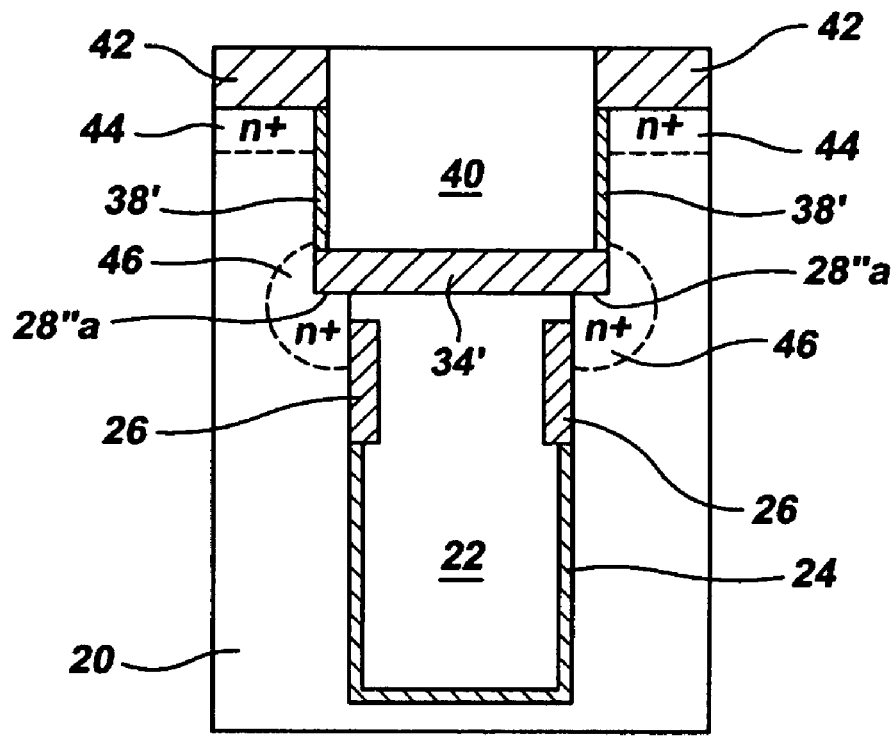
FIG. 12 is a side cross-sectional view of the structure of FIG. 11a after forming the vertical transistor in the upper trench portion and completing the DRAM.
Figure 13:
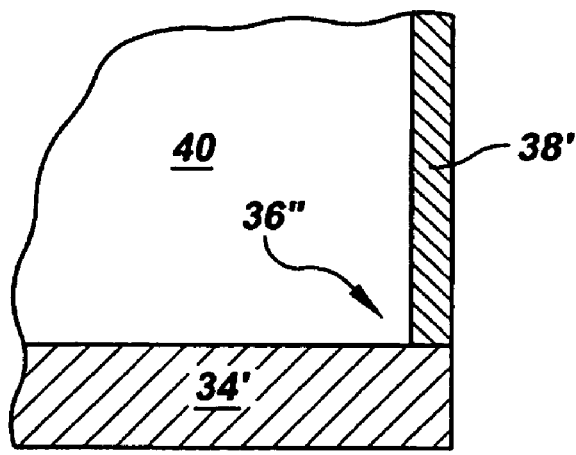
FIG. 13 is an enlargement of FIG. 12 of the corner portion of the trench near the TTO.

The upper MOSFET is completed by filling the trench with a conducting material (e.g., polysilicon, metal, and/or conducting metallic compound), and creating the drain regions with an n-type dopant. FIG. 12 shows a complete DRAM cell with the vertical transistor formed in the shaped upper trench. The gate conductor 40 is isolated from the lower capacitor solely by the uniform TTO 34', so that the problematic corner isolation issues are eliminated. Since the lower outward portions of the upper trench created by selective etch trench shaping are covered by TTO, the gate oxide can be grown only on and over the vertical trench sidewall, and the lower end of the vertical gate oxide layer extends no lower than the upper surface of the TTO as shown in more detail in FIG. 13. Consequently, the reliability and device issues in prior art due to the presence of sharp corners after trench shaping are successfully eliminated.

By taking advantage of the selective single-crystal semiconductor etching process of the present invention, the upper trench shaping of the DRAM cell can be performed before TTO deposition. This results in a uniform TTO layer in the final structure of the cell.

The process of the present invention eliminates the problems caused by prior art trench shaping that produces sharp corners and thin gate oxide at those corners, resulting in reliability concern and device performance variation. Consequently, the present invention produces a more reliable vertical trench DRAM memory.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a transistor portion over a capacitor in a vertical DRAM device comprising:
   providing a partially formed vertical DRAM structure having a lower trench portion filled with polycrystalline or amorphous semiconductor for a capacitor, the polycrystalline or amorphous semiconductor having an exposed upper surface, and an upper trench portion having exposed sidewalls of single-crystal semiconductor above the upper surface of the polycrystalline or amorphous semiconductor fill;
   etching the single-crystal semiconductor sidewalls to widen the upper trench portion beyond the exposed upper surface of the polycrystalline or amorphous semiconductor fill of the capacitor to form exposed regions of single-crystal semiconductor on a bottom portion of the upper trench adjacent to the exposed upper surface of the polycrystalline or amorphous semiconductor fill;
   depositing a trench top insulating layer on the bottom portion of the upper trench, over the upper surface of the polycrystalline or amorphous semiconductor fill and over the regions of single-crystal semiconductor adjacent to the upper surface of the polycrystalline or amorphous semiconductor fill;
   forming on the etched single-crystal semiconductor sidewalls of the upper trench portion a vertical gate dielectric layer, wherein the trench top insulating layer extends below the vertical gate insulating layer; and
   subsequently forming a vertical MOSFET to complete the vertical DRAM.

2. The method of claim 1 wherein the single-crystal semiconductor comprises single-crystal silicon and the amorphous or polycrystalline semiconductor comprises amorphous or polycrystalline silicon.

3. The method of claim 2 wherein the single-crystal semiconductor and the amorphous or polycrystalline semiconductor are doped with a semiconductor dopant selected from the group consisting of phosphorus (P), arsenic (As), antimony (Sb), boron (B), indium (In), and thallium (Tl).

4. The method of claim 3 wherein the semiconductor dopant has a concentration ranging from about $10^{14}$ cm$^{-3}$ to about $10^{21}$ cm$^{-3}$.

5. The method of claim 1 wherein the amorphous or polycrystalline semiconductor comprises amorphous or polycrystalline silicon doped by an n-type dopant with a doping concentration greater than $10^{19}$ cm$^{-3}$.

6. The method of claim 1 wherein the etching of the single-crystal semiconductor sidewalls is by simultaneous contact of the single-crystal semiconductor and polycrystalline or amorphous semiconductor with an ammonium hydroxide (NH$_4$OH) solution to selectively etch the single-crystal semiconductor.

7. The method of claim 6 wherein the etching of the single-crystal semiconductor sidewalls is by contact of the single-crystal semiconductor and polycrystalline or amorphous semiconductor with an ammonium hydroxide (NH$_4$OH) solution in the presence of an amount of light radiation sufficient to selectively etch the single-crystal semiconductor with respect to the amorphous or polycrystalline semiconductor.

8. The method of claim 6 wherein the ammonium hydroxide solution is simultaneously exposed to surfaces of the single-crystal semiconductor and the amorphous or polycrystalline semiconductor areas.

9. The method of claim 6 further including exposing the ammonium hydroxide solution to atmospheric air during the selective etching.

10. The method of claim 6 wherein the ammonium hydroxide solution is provided in an approximately 50:1 solution of water and NH$_4$OH.

11. The method of claim 1 wherein the trench top insulating layer has an upper surface, and the vertical gate dielectric layer extends no lower than the trench top insulating layer upper surface.

12. The method of claim 1 wherein the upper trench portion extends horizontally beyond all sides of the upper surface of the polycrystalline or amorphous semiconductor in the lower trench portion.

13. The method of claim 8 wherein the upper trench portion is rectangular in plan view.

14. The method of claim 1 wherein the trench top insulating layer is self-aligned to the sidewalls of the upper trench portion.

15. The method of claim 1 wherein the single-crystalline semiconductor comprises a material selected from a group consisting of silicon, germanium, silicon germanium, and carbon doped silicon.

16. The method of claim 15 wherein the amorphous or polycrystalline semiconductor comprises at least one material selected from a group consisting of silicon, germanium, silicon germanium, and carbon doped silicon.

* * * * *